(12) United States Patent
Yang et al.

(10) Patent No.: US 12,056,602 B2
(45) Date of Patent: Aug. 6, 2024

(54) CIRCUIT FOR CALCULATING WEIGHT ADJUSTMENTS OF AN ARTIFICIAL NEURAL NETWORK, AND A MODULE IMPLEMENTING A LONG SHORT-TERM ARTIFICIAL NEURAL NETWORK

(71) Applicant: Qatar Foundation for Education, Science and Community Development, Doha (QA)

(72) Inventors: Yin Yang, Doha (QA); Shiping Wen, Doha (QA); Tingwen Huang, Doha (QA)

(73) Assignee: Qatar Foundation for Education, Science, and Community Development, Doha (QA)

( * ) Notice: Subject to any disclaimer, the term of this patent is extended or adjusted under 35 U.S.C. 154(b) by 985 days.

(21) Appl. No.: 17/033,777

(22) Filed: Sep. 26, 2020

(65) Prior Publication Data

US 2021/0097379 A1 Apr. 1, 2021

Related U.S. Application Data

(60) Provisional application No. 62/906,405, filed on Sep. 26, 2019.

(51) Int. Cl.
*G11C 16/04* (2006.01)
*G06N 3/065* (2023.01)
*G06N 3/084* (2023.01)
*G11C 11/40* (2006.01)
*G11C 11/54* (2006.01)

(52) U.S. Cl.
CPC ............. *G06N 3/065* (2023.01); *G06N 3/084* (2013.01); *G11C 11/40* (2013.01); *G11C 11/54* (2013.01)

(58) Field of Classification Search
CPC ................................. G11C 11/54; G11C 11/40
See application file for complete search history.

(56) References Cited

U.S. PATENT DOCUMENTS

| | | | | |
|---|---|---|---|---|
| 11,625,588 B2* | 4/2023 | Hou | ................... | G11C 13/0004 706/41 |
| 2019/0318232 A1* | 10/2019 | Cruz-Albrecht | ....... | G06N 3/088 |
| 2020/0012924 A1* | 1/2020 | Ma | ........................ | G06V 10/764 |
| 2021/0406660 A1* | 12/2021 | Chen | ...................... | G06N 3/049 |

* cited by examiner

*Primary Examiner* — Pho M Luu
(74) *Attorney, Agent, or Firm* — Martin & Ferraro, LLP

(57) ABSTRACT

A circuit structure for implementing a multilayer artificial neural network, the circuit comprising: a plurality of memristors implementing a synaptic grid array, the memristors storing weights of the network; and a calculation and control module configured to calculate the value of weight adjustments within the network.

15 Claims, 7 Drawing Sheets

FIG. 5
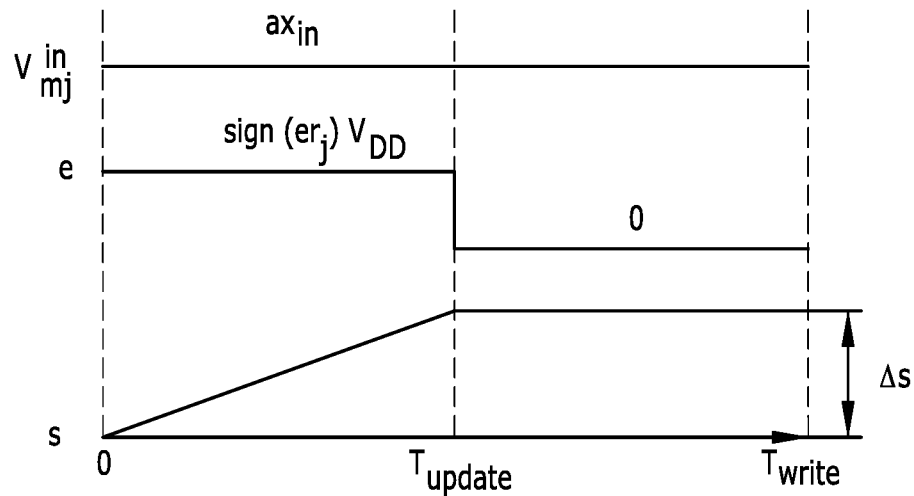
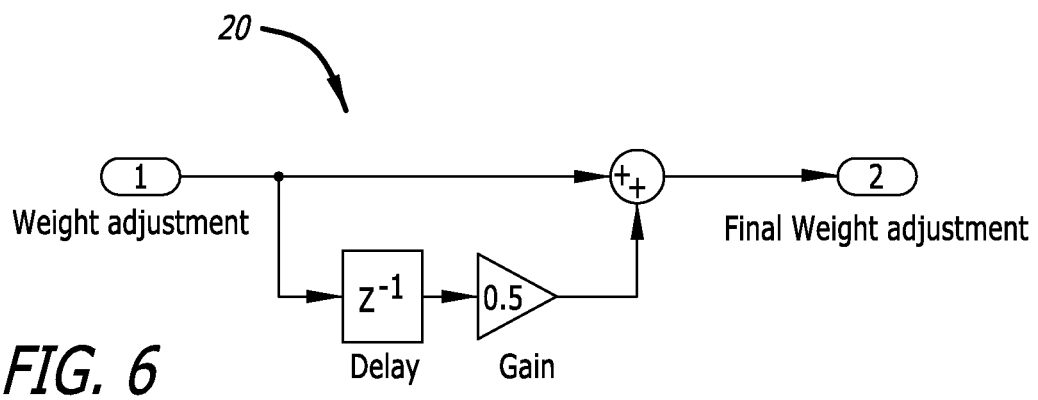
FIG. 6
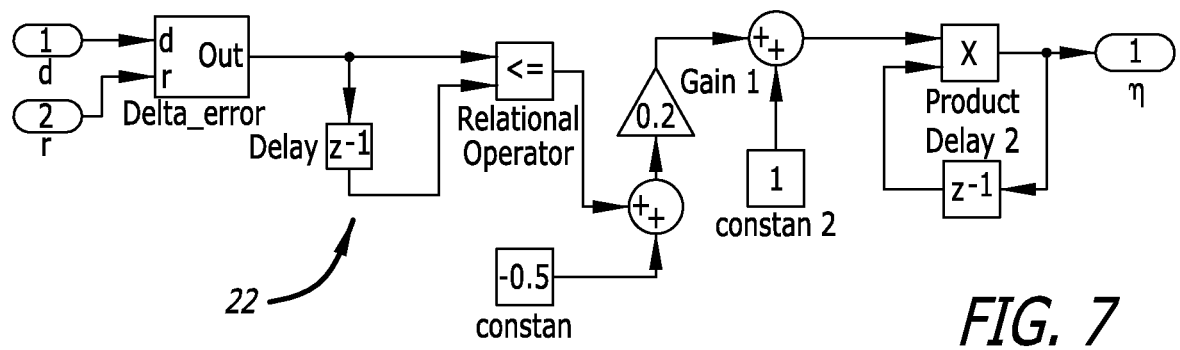
FIG. 7

CIRCUIT FOR CALCULATING WEIGHT ADJUSTMENTS OF AN ARTIFICIAL NEURAL NETWORK, AND A MODULE IMPLEMENTING A LONG SHORT-TERM ARTIFICIAL NEURAL NETWORK

RELATED APPLICATION

The present application claims the benefit of priority of Provisional Application No. 62/906,405, filed Sep. 26, 2019 which is hereby incorporated by reference herein.

BACKGROUND

The present application relates to the field of neural network hardware circuit design. The embodiments herein more particularly relate to a multilayer artificial neural network circuit with fast convergence and to long short-term memory neural network circuits based on memristors.

First, we provide an optimized design for a memristor-based multilayer perceptron (MLP) artificial neural network (ANN). In particular, the design incorporates momentum and adaptive learning rate adjustment to the training circuit, both of which significantly accelerate the convergence of network parameters. Second, based on the first component, this invention provides a complete long short-term memory (LSTM) ANN hardware circuit design based on a memristor crossbar structure.

Traditional circuits for implanting ANN are known to suffer the drawbacks of high power consumption and large hardware area.

Modern deep ANN have achieved dramatic performance improvements in various areas of machine learning. Yet, training a large-scale ANN usually takes a long time. Thus, efforts have been made to accelerate neural network training through hardware; in particular, neural network implementations have shifted from CPUs to GPUs, FPGAs, and customized ASICs such as Google's Tensor Processing Units (TPUs), available through their cloud platform. These advancements focus on improving the capabilities of processing units, by increasing their speed and parallelism. As the processing units become faster, the memory wall has emerged as a major performance bottleneck: no matter how fast the processing units can perform computations, they still need to wait for the memory to load inputs (i.e. ANN parameters and data), and write back outputs (adjusted parameters). Although memory size has been increasing exponentially, progress in the reduction of memory latency has been slower. This motivates novel computing architectures where the memory actively participates in computations.

In recent years, neural morphological systems have been studied extensively using traditional CMOS hardware. In such systems, each synaptic weight is stored in an SRAM unit, and computations such as training and prediction are done with pulse signals. New proprietary hardware includes PudianNao and IBM TrueNorth. However, CMOS-based designs suffer from several inherent problems, including high power leakage and low storage density. Consequently, a large amount of energy is required in storing, programming, and reading synaptic weights, which severely limits the scalability of such systems. This motivates memristor-based designs, which has unique electrical characteristics. Notably, multiplications can be done naturally and near-instantly, based on Ohm's law. This means that a large number of multiplication modules can be removed from the circuits, which dramatically simplifies circuit design and reduces power consumption, which, in turn, promises higher scalability and efficiency.

Memristors have been successfully fabricated using semiconductor materials at nanoscale. Hence, memristor-based neural morphological systems may potentially lead to major speed boosts to neural network computations.

Memristors are typically of nanometer size, and possess the characteristics of non-volatility, high density, low power consumption, and compatibility with CMOS technology. Although memristor-based neural morphological systems have witnessed several successful applications, training an ANN implementing memristors remains a difficult problem. Specifically, while nanoscale memristors provide the possibility for compact synaptic design, the scalability of ANN modules based on discrete systems is still challenged by the synaptic signalling pathway. The difficulty and cost of the pathway increase exponentially with the number of neurons or nodes being represented.

Hardware designs for implementing a stochastic gradient descent (SGD) algorithm have been proposed, which use memristors to implement scalable online learning of multilayer ANN. However, such training algorithms perform only basic SGD, which converges slowly and is liable to become "trapped" at saddle points. In other words, these algorithms have a relatively high probability of converging to one of multiple local minima having a far higher error that the global minimum, and therefore effectively becoming falsely optimised to a less desirable solution with a higher error than desired.

Modern software implementations of ANN are usually trained with SGD optimized with momentum and an adaptive learning schedule. Using a momentum term in the objective function of the training algorithm implements relatively large steps to avoid becoming trapped at specific localised saddle points. An adaptive learning schedule allows the momentum learning rate to change during learning at predefined stages, so as to enable avoidance of localised saddle points at early stages of the learning process, and then converge in smaller steps towards a global minimum value. These techniques, however, have not been applied to memristor-based neural morphological systems, and implementing them is highly non-trivial.

In addition to the aforementioned multi-layer neural network problem, we propose a new memristor-based design for recurrent neural networks (RNN) based on the long short-term memory (LSTM) memory cells. Existing memristor-based RNN neural network circuit designs are limited to basic Elman memory units, and no previous design has incorporated the more complex LSTM memory unit.

The present invention seeks to reduce or overcome one or more problems associated with the prior art.

SUMMARY

A preferred embodiment of this invention presents an online training circuit for memristor-based ANN with momentum and adaptive learning rate, and a LSTM neural network circuit system based on memristors.

Using these techniques we describe a multilayer ANN with high integration, using a memristor synapse circuit, which can be applied to pattern recognition, for example. Moreover, the momentum module and the adaptive learning rate modules are added to speed up convergence. Thus, the technical problems of poor expansibility, limited integration density, high power consumption and slow convergence speed are addressed.

According to a first aspect of the invention we provide a circuit structure for implementing a multilayer artificial neural network, the circuit comprising:

a plurality of memristors implementing a synaptic grid array, the memristors storing weights of the network; and a calculation and control module configured to calculate the value of weight adjustments within the network.

In some embodiments of the circuit structure, the synaptic grid arrays comprise memristor synapse circuits each having a memristor for storing a weight, a MOS tube comprising a PMOS transistor for inputting positive voltage signals quantized by samples to the memristor, and a NMOS transistor for inputting negative voltage signals to the memristor, having the same absolute value as PMOS; and a control signal input for controlling the on-off state of the PMOS and NMOS transistors.

In some embodiments of the circuit structure, the calculation and control module is configured to generate control signals by initiating a read process for reading the weight stored a memristor, calculating the output of the network; and initiating a write process for adjusting the weights of memristors.

In some embodiments, the circuit structure is configured such that during a first half of the read process the control signal $e=V_{DD}$, in which state the NMOS transistor is turned on and the PMOS transistor is off, the input voltage is $-V_{in}$, such that the current flows from the negative pole of the memristor to its positive electrode, and the value of the memristor increases with time, and during a second half of the read process the control signal $e=-V_{DD}$, the PMOS transistor is on, the NMOS transistor is off, and the input voltage is $-V_{in}$, such that the current then flows from the positive pole of the memristor to its negative electrode, such that the resistance of the memristor decreases by the same amount as it increased by during the first half of the read operation, thus returning it to its original state.

In some embodiments of the circuit structure, the input voltage pulses, and the memristor is multiply operated, to calculate the output of the weight stored by the memristor.

In some embodiments of the circuit structure, the calculation and control module is configured such that the value of the control signal is initially sign(error)$V_{DD}$, the conduction of the MOS tube depends on the sign of the error, the voltage signal from the MOS tube and its duration $T_{update}$ determines the correction quantity of the memristor, such that after time $T_{update}$, the value of the memristor is no longer changed until the writing process completes.

In some embodiments of the circuit structure, the calculation and control module comprises one or more local gradient computation modules, configured to calculate local gradients in the process of reverse propagation; one or more momentum modules, configured to add a momentum adjustment to the weight correction and speeding up the convergence of the circuit; and an adaptive learning rate module configured to adjust the learning rate by speeding up convergence of the circuit.

In some embodiments of the circuit structure, the local gradient computation module(s) comprises a $\delta_{last}$ calculation module for calculating the local gradient of the output layer; and a $\delta_{front}$ calculation module for calculating the local gradient of the hidden layers.

In some embodiments of the circuit structure, the $\delta_{last}$ calculation module satisfies the mean square error function and/or wherein the $\delta_{last}$ calculation module satisfies the cross entropy error function.

In some embodiments of the circuit structure, the $\delta_{front}$ calculation module comprises: a derivation of transfer function module configured to calculate the derivation of the transfer function at the corresponding input; and a synapse grid array module for calculating vector products of weights at each layer, and for determining the local gradient $\delta_{front+1}$ of next layer of the network.

In some embodiments of the circuit structure, the momentum module(s) comprises a sample and hold module, an adder and a multiplier, and preferably also comprises a comparator module, an amplifier and a constant module.

According to a second aspect of the invention we provide a memristor-based LSTM neural network system, comprising:

an internal loop control layer providing a data memory and a LSTM cell, wherein the data memory is configured to store data of an input layer of the network, and to store data after feature extraction; and an external classified output layer providing an external memristor crossbar and a voltage comparator, the external memristor crossbar being configured to classify features extracted by the internal loop control layer, and the voltage comparator being configured to compare the analog voltages output by the external memristor crossbar to obtain a comparison result of the analog voltage;

wherein an classification result is output based on the achieved comparison result.

In some embodiments of the memristor-based LSTM neural network system, the internal memristor crossbar includes voltage input ports, threshold memristors, voltage inverters, operational amplifiers and multipliers, wherein for each voltage input port connected to the threshold memristor there exists another one of the voltage input ports connected to the threshold memristor through a voltage inverter, and the operational amplifier is connected in parallel so that one end of the voltage inverter is connected with the operational amplifier where the output is connected, and the other end is connected to the input of the multiplier.

In some aspects of the memristor-based LSTM neural network system, the or each operational amplifier is connected in parallel with a threshold memristor so as to provide the operation function of a sigmoid activation function, and so as to transform current signal into voltage signal.

In some aspects of the memristor-based LSTM neural network system, the external memristor crossbar comprises voltage input ports, threshold memristors and voltage inverters, so that between two voltage input ports, a voltage input port is connected to a threshold memristor through a voltage inverter, and the other port is directly connected to a threshold memristor.

Other features of these aspects of the invention are set out in the appended claim set.

We describe the structure of a memristor-based LSTM hardware system. In broad terms the system comprises an internal loop control layer and an external classified output layer.

We provide a complete LSTM neural network hardware circuit design scheme based on the memristor crossbar, which overcomes the defects of high power consumption and large hardware area of the existing traditional materials.

Memristors, due to their nanoscale dimensions, non-volatility, high-density, low-power consumption, and compatibility with CMOS technology, simplify the hardware circuit design process and make ANN parameters (i.e. weights) easier to store. Moreover, memristors are smaller in size and higher in density than conventional materials used for storing network weights, resulting in a significant reduction in overall hardware area. Since the parameters saved in memristors are not lost during power down, the entire system consumes less energy.

Compared to the traditional neural network circuit, the circuit of multilayer neural network based on memristor does not have the disadvantage of electrical loss. This provides greater accuracy since the "stored" weights need not be re-populated. Due to the advantage that memristors have the functions of storage and operation, separate register and multiplication modules are no longer needed, which greatly simplifies the circuit, reduces the area and the power consumption of the ANN circuit. Meanwhile, the introduction of momentum and adaptive learning rate modules accelerates the convergence speed of the ANN.

BRIEF DESCRIPTION

We now describe features of embodiments of the invention, by way of example only, with reference to the accompanying drawings of which:

FIGS. 4 and 5 illustrate the variations of a memristor resistance value during a read process, and during the weight updating process (i.e. the write process), respectively;

FIG. 6 illustrates an example momentum module of embodiments of the present invention;

FIG. 7 illustrates an adaptive learning rate module of embodiments of the present invention;

DETAILED DESCRIPTION

Figure 1:
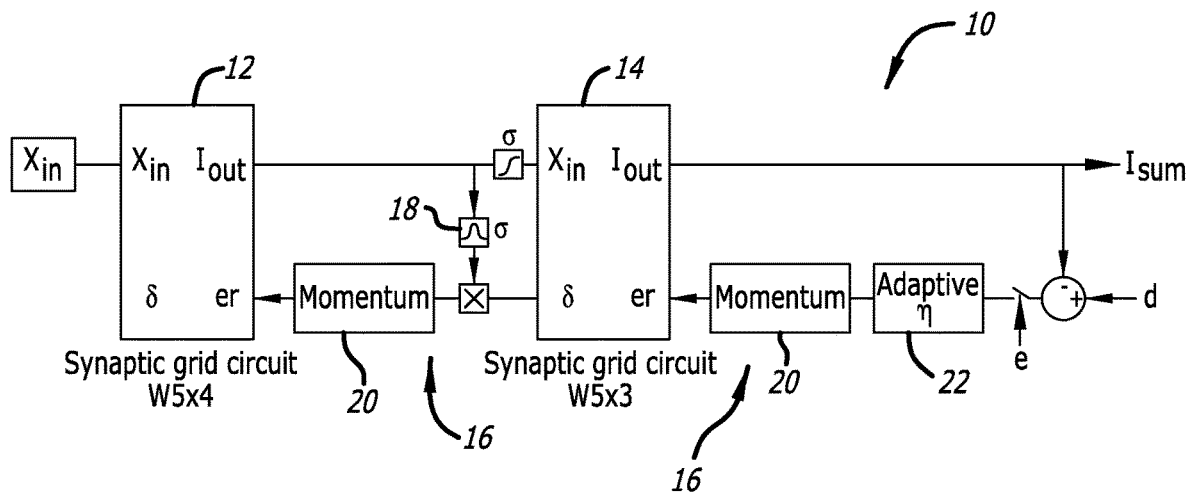
FIG. 1 is a schematic diagram of a multilayer neural network incorporating two synaptic grid circuits, according to embodiments of the present invention.

A circuit structure 10 of a multilayer neural network incorporating memristors is presented in FIG. 1. The diagram illustrates the multilayer neural network comprising two synaptic grid circuits 12, 14 (also referred to as synaptic grid arrays) designed to store weights, and to calculate outputs based on the received inputs and the stored weights. The circuit also comprises a calculation and control module 16, wherein the calculation and control module is designed to calculate the value of weight adjustment in response to each input and feedback.

Figure 2:
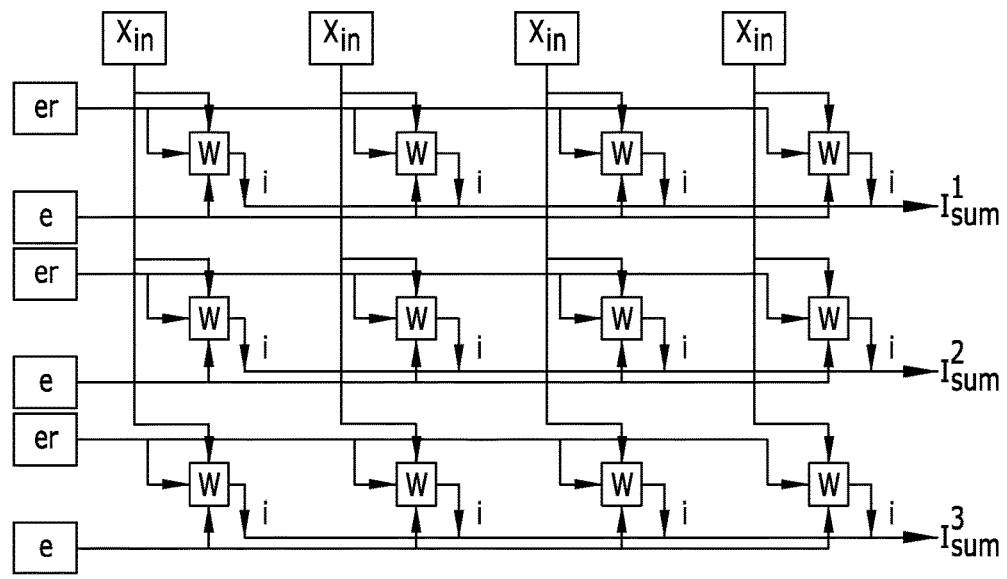
FIG. 2 is a schematic diagram of a synaptic grid circuit of the prior art.
Figure 3:
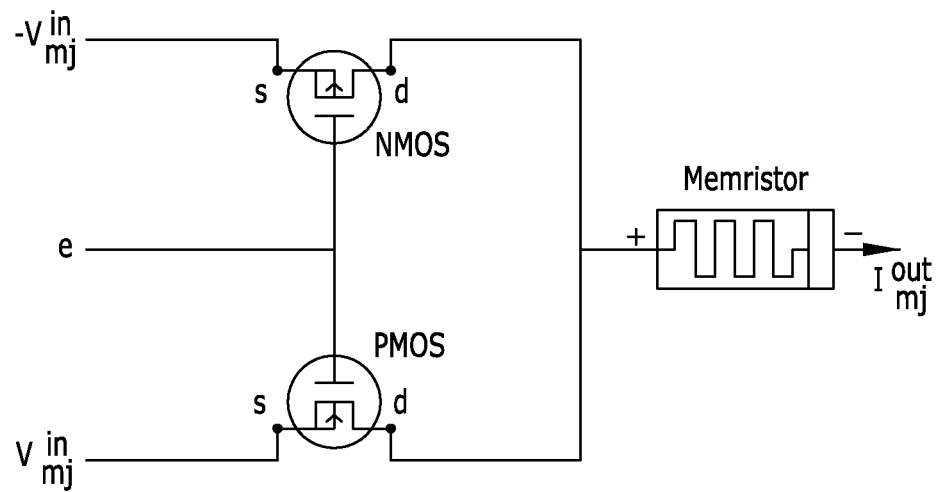
FIG. 3 is a schematic diagram of a synapse circuit consisting of two MOS tubes and one memristor.

FIGS. 2 to 5 of the accompanying drawings illustrate an implementation of the features of the multilayer neural network. FIG. 2 illustrates a synaptic grid array, as is known in the art. A suitable memristor synapse circuit is as shown in FIG. 3, comprising: a memristor for storing a weight; a PMOS transistor for inputting positive voltage signals (quantized by samples); an NMOS transistor for inputting negative voltage signals (of the same value as that of PMOS); and a control signal e to turn operation of the MOS tube on/off.

Each control step comprises a read process for reading the weight stored by memristor and calculating the output of the network; and a write process for adjusting the weight of memristor.

Figure 4:
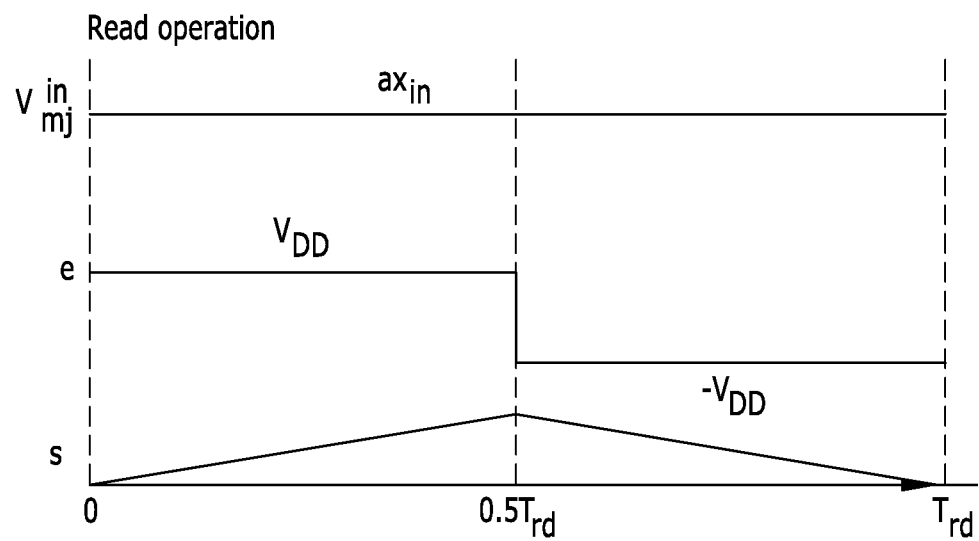

According to an embodiment herein, and as illustrated in FIG. 4, the duration of the read process is $T_{rd}$. During the first half of the read process, the control signal $e=V_{DD}$ results in the NMOS being turned on, the PMOS being turned off. The input voltage is $-V_{in}$. As current flows from the negative pole of the memristor to the positive electrode, the value of the memristor (S) increases with time. In the remaining half of the read process, the control signal $e=-V_{DD}$, so that the PMOS is on, and the NMOS is off. The input voltage is thus again $-V_{in}$. The current then flows from the positive pole of the memristor to the negative electrode. The resistance of the memristor decreases by the same amount as in the first half of the operation, returning to the state before the read process. The variation of the memristor resistance value during a read process is as shown in FIG. 4. At the time 0+, the input voltage pulses and the memristor are multiply operated, calculating the output.

According to an embodiment herein, the duration of the write process is $T_{write}$. The value of the control signal is initially sign(error)$V_{DD}$ and the duration is $T_{update}$. The conduction of the MOS tube depends on the sign of the error. The voltage signal from the MOS tube and its duration determines the correction quantity of the memristor. After $T_{update}$, the value of the memristor is no longer changed until the writing process is over. The variation of the memristor value during the weight updating process is as shown in FIG. 5. The $T_{update}$ is obtained by the calculation and control module.

According to an embodiment herein, the calculation and control module comprises one or more local gradient computation modules 18, wherein the local gradient computation modules 18 are designed for calculating local gradients in the process of reverse propagation. The calculation and control module further includes one or more momentum modules 20, wherein the momentum modules 20 are designed for adding a momentum to the weight correction and speeding up the convergence of the circuit. The circuit further includes an adaptive learning rate module 22, wherein the adaptive learning rate module 22 is designed for adjusting the learning rate and speeding up the convergence of the circuit, as is known in the art.

The local gradient computation modules 18 may, for example, comprise: a $\delta_{last}$ calculation module, wherein the $\delta_{last}$ calculation module is designed for calculating the local gradient of the output layer; and $\delta_{front}$ calculation module is designed for calculating the local gradient of the hidden layers. According to an embodiment herein, the $\delta_{last}$ calculation module satisfies the mean square error function; or, alternatively the $\delta_{last}$ calculation module may satisfy the cross entropy error function.

According to an embodiment herein, the $\delta_{front}$ calculation module comprises: a derivation of transfer function module, wherein the derivation of transfer function module is designed for calculating the derivation of the transfer function at the corresponding input; and the synapse grid array module is designed for calculating vector product of weights and local gradient $\delta_{front+1}$ of next layer.

A suitable momentum module 20 is set out in FIG. 6. The momentum module 20 uses a sample and hold module, an adder and a multiplier as shown in FIG. 6. The values applied by the momentum module may be predefined and/or encoded to suitable values as will be understood by the skilled person.

An adaptive learning rate module 22 suitable for use in the system of the present invention is shown in FIG. 7. The adaptive learning rate module 22 may include, for example, a comparator module, a sample and hold module, an adder, a multiplier, an amplifier, and a constant module as shown in FIG. 7. The parameters applied by the adaptive learning rate module 22 may be predefined and/or encoded to suitable values as will be understood by the skilled person.

In an example implementation in which a data set has been used to train the network, the Iris data set has been used. The data set has a sample size of 150. It is divided into two equal halves, so that the sample sizes of training samples and test samples are both 75. The dimensionality of the data set is 4. There are three different class labels: 1, -1, -1 represents Setosa, -1, 1, -1 represents Versicolour, -1, -1, 1 represents Virginia. A pulse electrical signal is derived from the Iris data set. The iteration period of neuromorphic computing circuit is 0.1 s. Because the input signal of the circuit is pulse form, the input sample should be processed first. In the scheme, 0.1 s is divided into 1000 pulse signals, that is, the circuit interface receives an input pulse vector $x_{in}$, a control pulse e and a target output vector d per $10^{-4}$ seconds.

Figure 8:
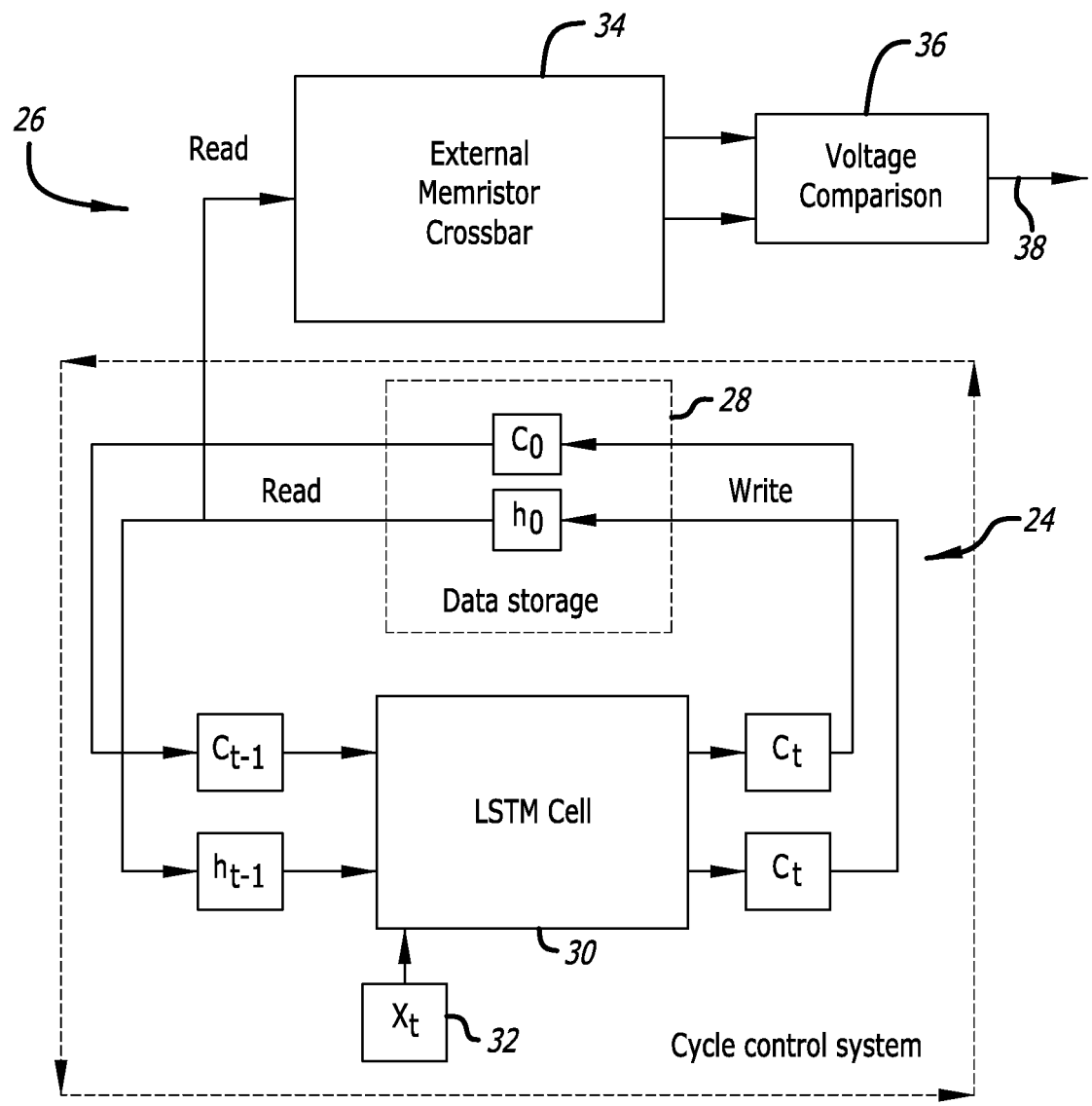
FIG. 8 is a block diagram of a memristor-based LSTM hardware system of embodiments of the present invention.

Turning now to FIGS. 8 to 11, a memristor-based LSTM neural network system is described. FIG. 8 illustrates the overall structure of the system, which comprises an "internal loop" control layer 24 and an "external" classified output layer 26. The internal loop control layer 24 includes a data memory 28 and a LSTM cell 30, wherein the data memory is configured to store data of the input layer and data after feature extraction.

The LSTM cell 30 comprises n units. In the example shown in FIG. 9, n=64, and as a result the LSTM 30 includes 64 LSTM units (of which four are shown). It can be seen that at each time step t, cell state c, and hidden state h from the data memory 28 is fed as an input to the LSTM cell. In the example given, 64 c values representing the current state of the system are fed as inputs $c_{t-1}(1)$ to $c_{t-1}(64)$ to the 64 respective LSTM units.

Similarly, 64 hidden state values $h_{t-1}[1, \ldots, 64]$ are also received from the data memory 28, as input to each of the LSTM units. The input 32 to the system at time t, $x_t$, is also input to each LSTM unit. In the example given, the input 32 comprises 50 values $x[1, \ldots, 50]$. Of course it should be understood that the same general structure and principals apply where n is any other number (and not necessarily 64), and where the input comprises more or less than 50 values.

Figure 9:
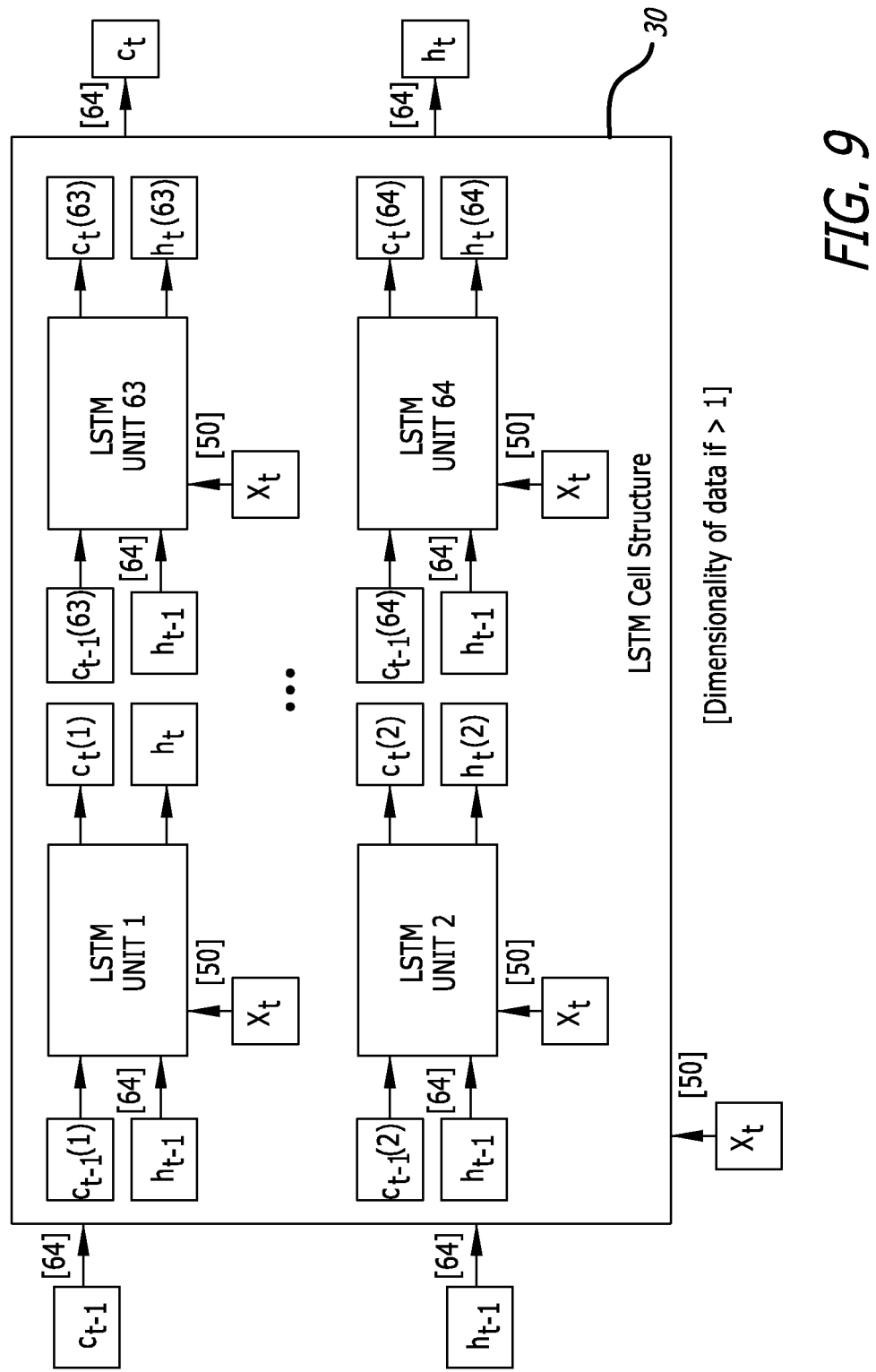
FIG. 9 illustrates a circuit diagram of an LSTM Cell internal unit structure based on memristor crossbars according to embodiments of the present invention.

FIG. 9 shows that each LSTM unit takes an input comprising its respective values of c, the array h of hidden values, and input x comprising an array of input values. The LSTM unit implements a 'forget gate', 'input gate' and 'output gate' as is known in the art. These gates are implemented as set out in FIG. 10 using a memristor crossbar.

Figure 10:
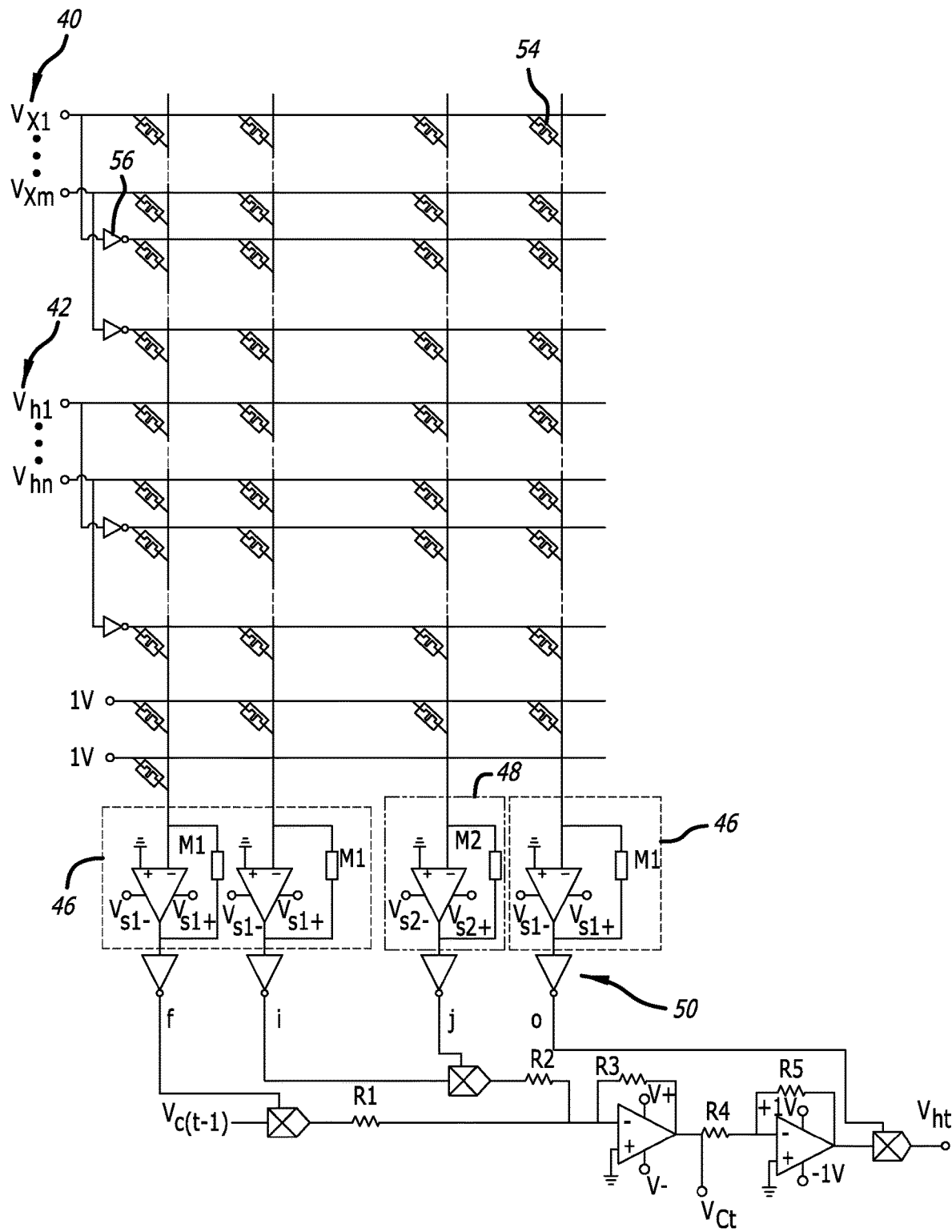
FIG. 10 illustrates a single unit circuit diagram inside the LSTM Cell of embodiments of the present invention.

FIG. 10 illustrates a 230×4 memristor crossbar. As shown in FIG. 10, the input voltages in the circuit include $V_{X1}$ to $V_{Xm}$ (40) (corresponding to inputs $X_1$ to $X_m$, where m=50 in the example according to FIG. 9) and $V_{h1}$ to $V_{hn}$ (42) (corresponding to hidden state values $h_1$ to $h_n$, where n=64 in this example), and the voltages are input to the trunk circuit through the voltage input port.

A threshold memristor can only express a positive weight, and in any adjacent voltage input port of the present invention, a voltage input port and a threshold memristor are connected by a voltage inverter (56, for example). A voltage input port and a threshold memristor are directly connected, so that two adjacent threshold memristors are configured to express a positive and negative weight. For example, looking at FIG. 10, the first set of rows receive input voltage $V_{X1}$ to $V_{Xm}$ (i.e. to $V_{X50}$). The following rows replicate those same input voltages but via voltage inverters 56, so that the memristors of those rows express corresponding positive and negative weights.

In the same manner, the following rows receiving voltage inputs $V_{h1}$ to $V_{hn}$ (i.e. to $V_{h64}$ in the given example) are replicated in the next set of rows, each via a voltage inverter 56.

Both M1 and M2 are threshold memristors, $V_{s1+}$ is 1V DC voltage, $V_{s1-}$ ground, $V_{s2+}$ is 1V DC voltage, $V_{s2-}$ is -1V DC voltage, and the values of resistors $R_1$-$R_5$ should be identical (between 1K ohm to 10K ohm).

The operational amplifiers 46 are connected in parallel with the threshold memristors $M_1$, as shown in FIG. 10, to implement the sigmoid activation function and convert the current signal into a voltage signal.

A further operational amplifier 48 is connected in parallel with the threshold memristor $M_2$ to implement a hyperbolic tangent activation function and convert the current signal into a voltage signal. One end of the voltage inverter is connected to the output of the operational amplifier, and the other end is connected to the input of the multiplier for converting the direction of the voltage.

Figure 11:
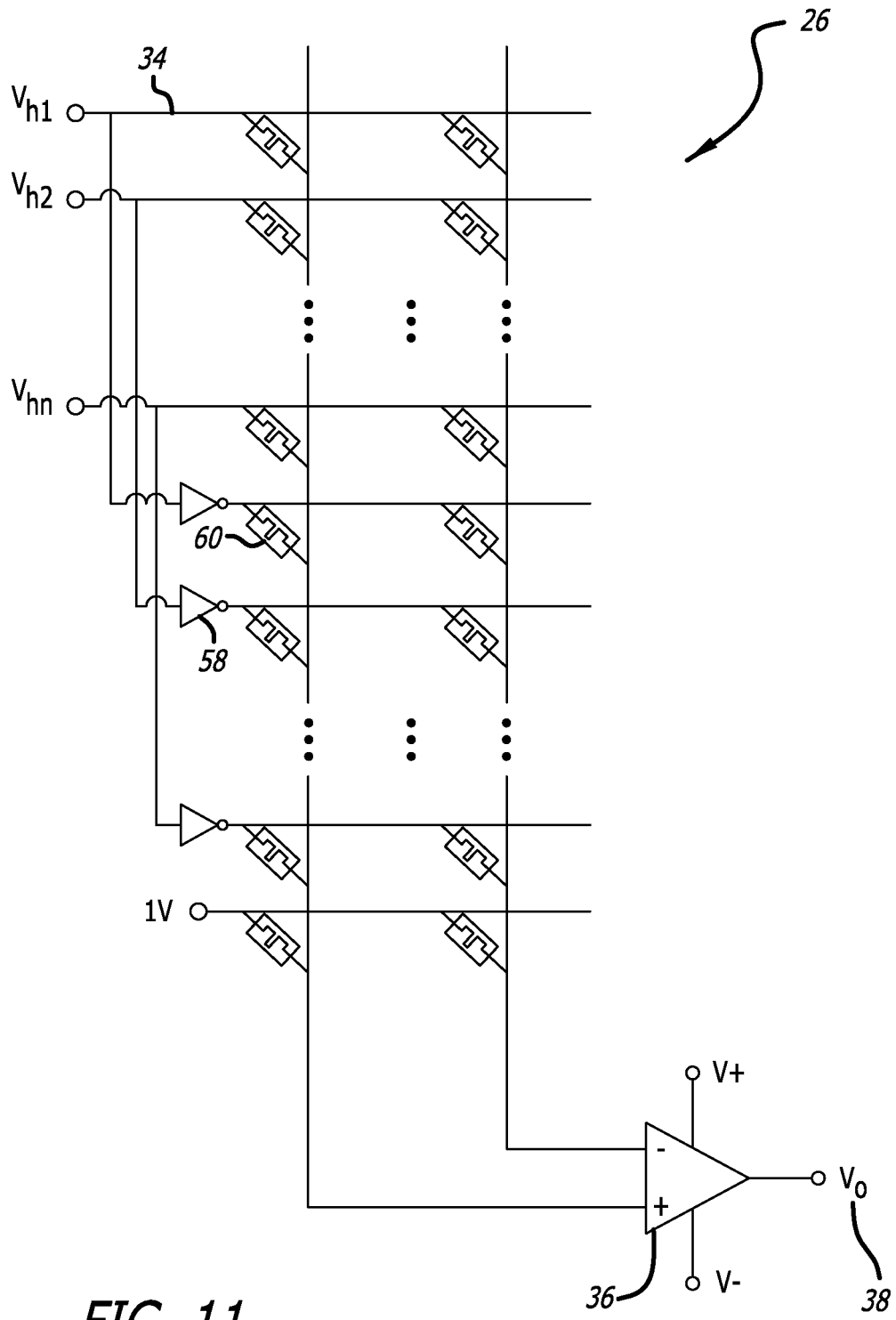
FIG. 11 illustrates an external circuit diagram of an LSTM based memristor crossbar according to embodiments of the present invention.

According to an embodiment herein, the external classified output layer includes an external memristive crossbar circuit 34 and an auxiliary circuit, wherein the external memristive crossbar circuit 34 includes voltage input ports (labelled $V_{h1}$ to $V_{hn}$ in FIG. 11), threshold memristors 60, and voltage inverters 58. The specific implementation circuit is shown in FIG. 11. Among any adjacent voltage input ports, one voltage input port is connected to the threshold memristor through a voltage inverter, and the other voltage input port is directly connected to the threshold memristor. There is no electrical connection at the intersection of the crossbar. The auxiliary circuit is a voltage comparator 36 that compares the analogue voltages to obtain a comparison of the analogue voltages. The result of the comparison is finally taken as the classification result $V_o$ (38) of the input layer.

Embodiments of the subject matter and the functional operations described herein can be implemented in digital electronic circuitry, or in computer software, firmware, or hardware, including the structures disclosed in this specification and their structural equivalents, or in combinations of one or more of them.

Some embodiments are implemented using one or more modules of computer program instructions encoded on a computer-readable medium for execution by, or to control the operation of, a data processing apparatus. The computer-readable medium can be a manufactured product, such as hard drive in a computer system or an embedded system. The computer-readable medium can be acquired separately and later encoded with the one or more modules of computer program instructions, such as by delivery of the one or more modules of computer program instructions over a wired or wireless network. The computer-readable medium can be a machine-readable storage device, a machine-readable storage substrate, a memory device, or a combination of one or more of them. As used herein, in some embodiments the term module comprises a memory and/or a processor configured to control at least one process of a system or a circuit structure. The memory storing executable instructions which, when executed by the processor, cause the processor to provide an output to perform the at least one process. Embodiments of the memory include non-transitory computer readable media.

The terms "computing device" and "data processing apparatus" encompass all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, a runtime environment, or a combination of one or more of them. In addition, the apparatus can employ various different computing model infrastructures, such as web services, distributed computing and grid computing infrastructures.

The processes and logic flows described in this specification can be performed by one or more programmable processors executing one or more computer programs to perform functions by operating on input data and generating output.

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. However, a computer need not have such devices. Devices suitable for storing computer program instructions and data include all forms of non-volatile memory, media and memory devices, including by way of example semiconductor memory devices, e.g., EPROM (Erasable Programmable Read-Only Memory), EEPROM (Electrically Erasable Programmable Read-Only Memory), and flash memory devices; magnetic disks, e.g., internal hard disks or removable disks; magneto-optical disks; and CD-ROM and DVD-ROM disks.

To provide for interaction with a user, some embodiments are implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

The computing system can include clients and servers. A client and server are generally remote from each other and typically interact through a communication network. The relationship of client and server arises by virtue of computer programs running on the respective computers and having a client-server relationship to each other. Embodiments of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described is this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

Therefore, while the embodiments herein have been described in terms of preferred embodiments, those skilled in the art will recognise that the embodiments herein can be practiced with modification within the spirit and scope of the appended claims.

When used in this specification and claims, the terms "comprises" and "comprising" and variations thereof mean that the specified features, steps or integers are included. The terms are not to be interpreted to exclude the presence of other features, steps or components.

The features disclosed in the foregoing description, or the following claims, or the accompanying drawings, expressed in their specific forms or in terms of a means for performing the disclosed function, or a method or process for attaining the disclosed result, as appropriate, may, separately, or in any combination of such features, be utilised for realising the invention in diverse forms thereof.

Although certain example embodiments of the invention have been described, the scope of the appended claims is not intended to be limited solely to these embodiments. The claims are to be construed literally, purposively, and/or to encompass equivalents.

What is claimed is:

1. A circuit structure for implementing a multilayer artificial neural network, the circuit structure comprising:
   a plurality of memristors implementing a synaptic grid array, the memristors storing weights of the network;
   a calculation controller configured to calculate the value of weight adjustments within the network; wherein the synaptic grid array comprises memristor synapse circuits each having
   a memristor for storing a weight,
   a MOS tube comprising
     a PMOS transistor for inputting positive voltage signals quantized by samples to the memristor, and
     a NMOS transistor for inputting negative voltage signals to the memristor, having the same absolute value as PMOS; and
   a control signal input for controlling the on-off state of the PMOS and NMOS transistors.

2. The circuit structure according to claim 1, wherein the calculation controller is configured to generate control signals by:
   initiating a read process for reading the weight stored a memristor,
   calculating the output of the network; and
   initiating a write process for adjusting the weights of memristors.

3. The circuit structure according to claim 2, configured such that:
   during a first half of the read process the control signal $e=V_{DD}$, in which state the NMOS transistor is turned on and the PMOS transistor is off, the input voltage is $-V_{in}$, such that the current flows from the negative pole of the memristor to its positive electrode, and the value of the memristor increases with time, and
   during a second half of the read process the control signal $e=-V_{DD}$, the PMOS transistor is on, the NMOS transistor is off, and the input voltage is $-V_{in}$, such that the current then flows from the positive pole of the memristor to its negative electrode, such that the resistance of the memristor decreases by the same amount as it increased by during the first half of the read operation, thus returning it to its original state.

4. The circuit structure according to claim 3, wherein the input voltage pulses, and the memristor is multiply operated, to calculate the output of the weight stored by the memristor.

5. The circuit structure according to claim 1, wherein the calculation controller is configured such that
the value of the control signal is initially sign(error) $V_{DD}$,
the conduction of the MOS tube depends on the sign of the error,
the voltage signal from the MOS tube and its duration $T_{update}$ determines the correction quantity of the memristor, such that after time $T_{update}$, the value of the memristor is no longer changed until the writing process completes.

6. The circuit structure according to claim 1, wherein the calculation controller further comprises:
one or more local gradient computation configured to calculate local gradients in the process of reverse propagation;
one or more momentum computation configured to add a momentum adjustment to the weight correction and speeding up the convergence of the circuit; and
an adaptive learning rate configured to adjust the learning rate by speeding up convergence of the circuit.

7. The circuit structure according to claim 6, wherein the local gradient computation comprises:
a $\delta_{last}$ calculation for calculating the local gradient of the output layer; and
a $\delta_{front}$ calculation for calculating the local gradient of the hidden layers.

8. The circuit structure according to claim 7, wherein the $\delta_{last}$ calculation satisfies the mean square error function and/or wherein the $\delta_{last}$ calculation satisfies the cross entropy error function.

9. The circuit structure according to claim 7, wherein the $\delta_{front}$ calculation comprises:
a derivation of transfer configured to calculate the derivation of the transfer function at the corresponding input; and
a synapse grid array for calculating vector products of weights at each layer, and for determining the local gradient $\delta_{front+1}$ of next layer of the network.

10. The circuit structure according to claim 6, wherein the momentum computation comprises a sample and hold, an adder and a multiplier, and preferably also comprises a comparator, an amplifier and a constant.

11. A memristor-based LSTM neural network system, comprising:
an internal loop control layer providing a data memory and a LSTM cell, wherein the data memory is configured to store data of an input layer of the network, and to store data after feature extraction; and
an external classified output layer providing an external memristor crossbar and a voltage comparator, the external memristor crossbar being configured to classify features extracted by the internal loop control layer, and the voltage comparator being configured to compare the analog voltages output by the external memristor crossbar to obtain a comparison result of the analog voltage;
wherein an classification result is output based on the achieved comparison result.

12. The memristor-based LSTM neural network system according to claim 11, wherein the internal memristor crossbar includes
voltage input ports,
threshold memristors,
voltage inverters,
operational amplifiers and
multipliers,
wherein for each voltage input port connected to the threshold memristor there exists another one of the voltage input ports connected to the threshold memristor through a voltage inverter, and
the operational amplifier is connected in parallel so that one end of the voltage inverter is connected with the operational amplifier where the output is connected, and the other end is connected to the input of the multiplier.

13. The memristor-based LSTM neural network system according to claim 12, wherein the or each operational amplifier is connected in parallel with a threshold memristor so as to provide the operation function of a sigmoid activation function, and so as to transform current signal into voltage signal.

14. The memristor-based LSTM neural network system according to claim 13, wherein the external memristor crossbar comprises voltage input ports, threshold memristors and voltage inverters, so that between two voltage input ports, a voltage input port is connected to a threshold memristor through a voltage inverter, and the other port is directly connected to a threshold memristor.

15. A circuit structure for implementing a multilayer artificial neural network, the circuit structure comprising:
a plurality of memristors implementing a synaptic grid array, the memristors storing weights of the network;
a calculation controller configured to calculate the value of weight adjustments within the network;
wherein the calculation controller further comprises:
one or more local gradient computation configured to calculate local gradients in the process of reverse propagation;
one or more momentum computation configured to add a momentum adjustment to the weight correction and speeding up the convergence of the circuit; and
an adaptive learning rate configured to adjust the learning rate by speeding up convergence of the circuit.

* * * * *